(12) United States Patent
Park

(10) Patent No.: US 7,541,215 B2
(45) Date of Patent: Jun. 2, 2009

(54) IMAGE SENSOR AND METHOD FOR MANUFACTURING THE SAME

(75) Inventor: Jin Ho Park, Yeongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/122,172

(22) Filed: May 16, 2008

(65) Prior Publication Data

US 2008/0283949 A1      Nov. 20, 2008

(30) Foreign Application Priority Data

May 16, 2007     (KR)     ............... 10-2007-0047590

(51) Int. Cl.
    *H01L 21/00*     (2006.01)
(52) U.S. Cl. ................................ 438/70; 257/440
(58) Field of Classification Search .............. 438/70; 257/440
    See application file for complete search history.

(56) References Cited

U.S. PATENT DOCUMENTS

| 2005/0101049 | A1* | 5/2005 | Kim | 438/66 |
| 2006/0275944 | A1* | 12/2006 | Hyun | 438/70 |
| 2006/0292731 | A1* | 12/2006 | Kim | 438/57 |
| 2007/0158772 | A1* | 7/2007 | Boettiger | 257/432 |
| 2008/0017945 | A1* | 1/2008 | Wu et al. | 257/440 |

* cited by examiner

*Primary Examiner*—Thao X Le
*Assistant Examiner*—Kimberly Trice
(74) *Attorney, Agent, or Firm*—Saliwanchik, Lloyd & Saliwanchik

(57) ABSTRACT

An image sensor and a method for manufacturing the same are provided. The image sensor comprises a pixel region defined on a substrate, an interlayer dielectric on the substrate and comprising a trench above the pixel region, a color filter within the trench, and a microlens on the color filter.

7 Claims, 3 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0047590, filed on May 16, 2007, which is hereby incorporated by reference in its entirety.

BACKGROUND

In manufacturing processes for image sensors according to a related art, methods for forming microlenses generally involve performing a photolithography process using a special photoresist for microlenses, and then performing reflowing process. With recent developments in image sensor technology, the thicknesses of microlenses are progressively decreasing.

However, when photoresists currently in use are subjected to the related art processing, striation occurs, causing reduced pixel region uniformity. The main cause for this limitation is the occurrence of a planar offset between a scribe line and a pixel region.

Specifically, in the related art, when striation due to a height difference at the border between a scribe line and a pixel region occurs, the thicknesses of microlenses in the pixel region are different, causing the focal points of the microlenses to be different.

In particular, while this limitation presents little variance at the center of the pixel region, the occurrence of cross talk becomes more pronounced toward the edge of the pixel region, resulting in the generation of noise and reduced sensitivity.

BRIEF SUMMARY

Embodiments of the present invention provide image sensors and methods for manufacturing the same that can inhibit the occurrence of striation in a pixel region and increase the sensitivity of a microlens.

In one embodiment, an image sensor comprises: a pixel region defined on a substrate; an interlayer dielectric on the substrate and comprising a trench above the pixel region; a color filter within the trench; and a microlens on the color filter.

In another embodiment, a method for manufacturing an image sensor comprises: defining a pixel region and a scribe region on a substrate; forming an interlayer dielectric on the substrate; forming a trench above the pixel region through selectively etching the interlayer dielectric; forming a color filter in the trench; and forming a microlens on the color filter.

The details of one or more embodiments are set forth in the accompanying drawings and the description below. Other features will be apparent from the description and drawings, and from the claims.

DETAILED DESCRIPTION

Hereinafter, image sensors and methods for manufacturing the same according to an embodiment of the present invention will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
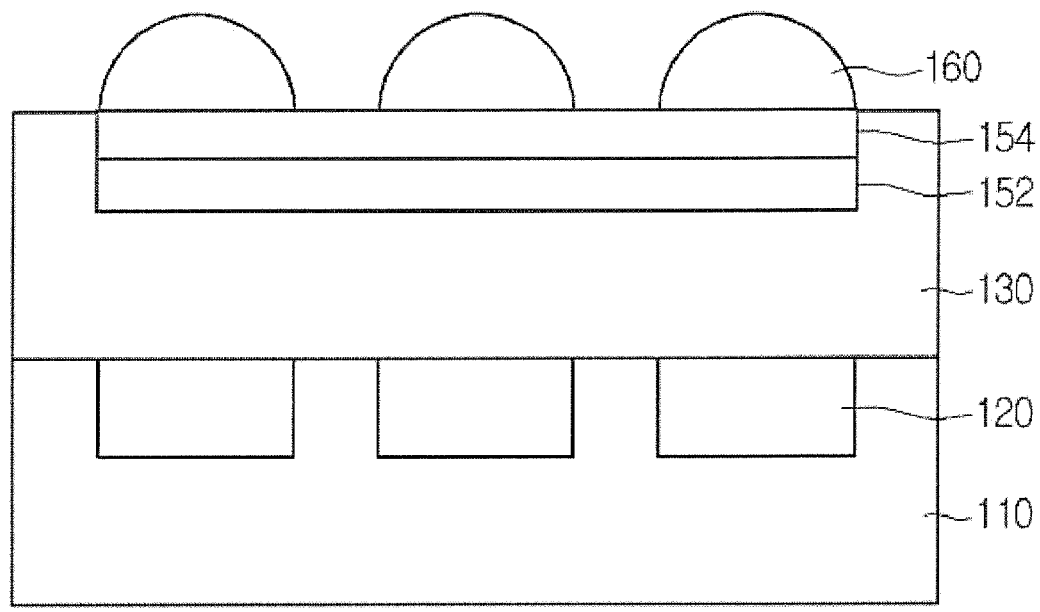
FIG. 1 is a cross-sectional view of an image sensor in accordance with an embodiment of the present invention.

Referring to FIG. 1, an image sensor according to an embodiment includes a pixel region (provided with photodiodes 120) and a scribe region (not shown) defined on a substrate 110, an interlayer dielectric 130 on the substrate 110 and including a trench above the pixel region, a color filter 152 within the trench, and a microlens 160 on the color filter 152.

Further embodiments can include a planarization layer 154 on the color filter 152.

Here, the microlens 160 can be formed on the planarization layer 154. According to embodiments, an upper surface of the interlayer dielectric 130 and an underside of the microlens 160 can be at the same height, which can reduce the height difference between a scribe line and a pixel region.

Accordingly, for embodiments including the planarization layer 154, the depth of the trench in the interlayer dielectric 130 can be equal to a sum of thicknesses of the color filter 152 and the planarization layer 154.

In an image sensor according to present embodiments, only a pixel region is opened and an array etch method is performed. Accordingly, embodiments of the present invention reduce the height difference between the scribe line and the pixel region. In addition, embodiments can inhibit the occurrence of striation and increase the sensitivity of the microlenses formed in the image sensor.

Below, a description will be provided of a method for manufacturing an image sensor according to an embodiment.

Figure 2:
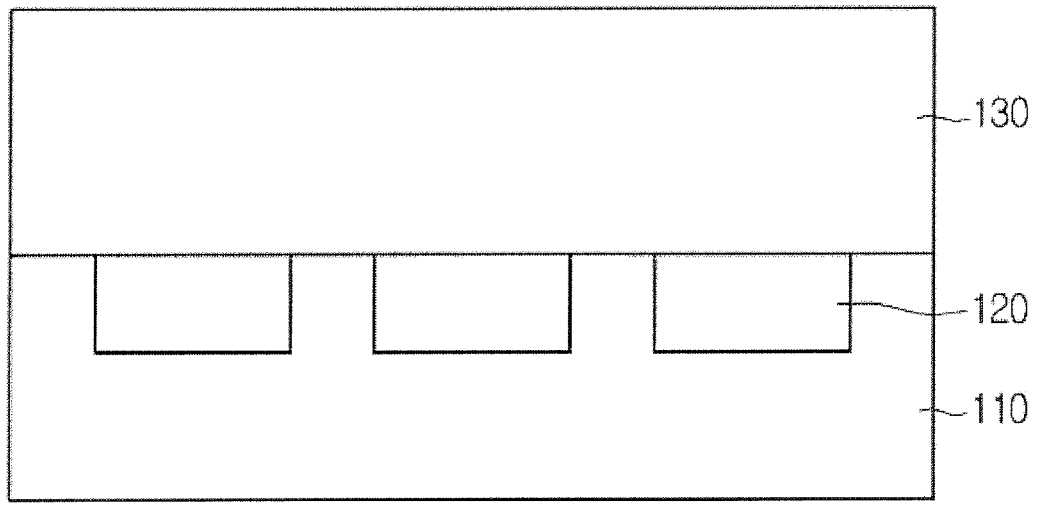
FIGS. 2 to 5 are cross-sectional views for describing a method of manufacturing an image sensor according to an embodiment of the present invention.

Referring to FIG. 2, a pixel region and a scribe region (not shown) can be defined on a substrate 110. A photodiode 120 and a transistor (not shown) can be formed on the pixel region for each unit pixel.

An interlayer dielectric 130 can be formed on the substrate 110 including the photodiode 120. In an embodiment, the interlayer dielectric 130 can be formed as a multilayer structure. For example, a first interlayer dielectric can be formed on the substrate 110, and then a light shielding layer (not shown) can be formed for blocking light incident on regions other than the photodiode 120 region. A second interlayer dielectric can then be formed on the light shielding layer to complete the multilayer structure.

Also, in certain embodiments, a protective layer (not shown) can further be formed on the interlayer dielectric 130 to protect the device from moisture and scratches.

Figure 3:
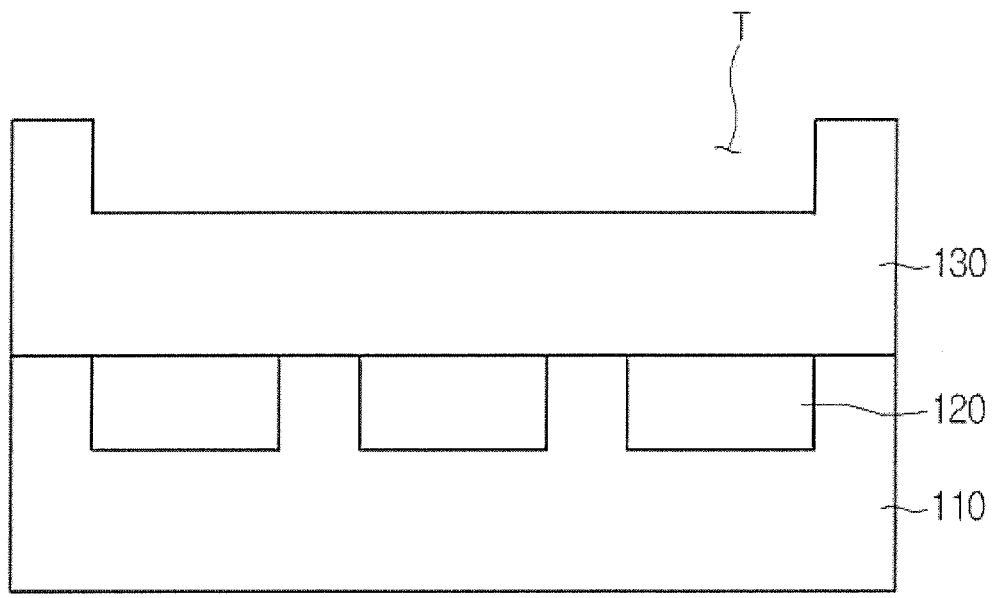

Next, referring to FIG. 3, a trench T can be formed on the pixel region by selectively etching the interlayer dielectric 130.

The trench T can be formed to reduce a height difference between a scribe line and the pixel region to inhibit the occurrence of striation.

For example, an array etch can be performed only on the pixel region. That is, according to an embodiment, the etching of the interlayer dielectric 130 at the upper side of pixel region can be performed using, for example, a reverse poly mask. The reverse poly mask can have a pattern that is the reverse of a poly mask for defining the pixel region.

Figure 4:
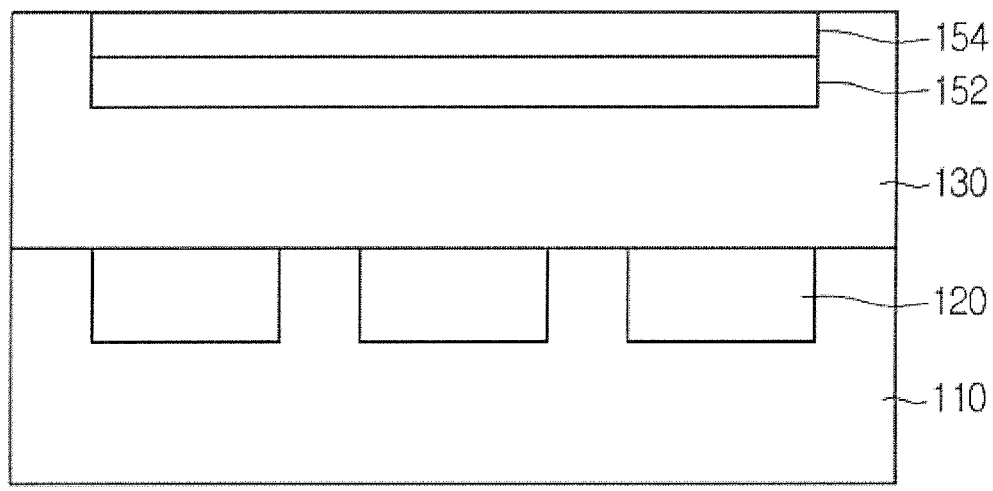

Referring to FIG. 4, a color filter 152 can be formed in the trench T. In one embodiment, the color filter 152 can be formed by applying a dyeable resist on the trench T, and performing exposure and development processes. In certain embodiments, a red, green, and blue (R, G, B) color filter 152 to filter respective spectrums of light can be formed.

In a further embodiment, a planarization layer (PL) 154 can be formed on the color filter 152. The planarization layer can be used to adjust focal distance and/or provide levelness for forming a lens layer.

Here, according to embodiments, the sum of the thicknesses of the color filter 152 and the planarization layer 154 can be the same as the depth of the trench T. Thus, an offset in height between the scribe line and the pixel region can be reduced to inhibit the occurrence of striation.

For example, the trench T can be formed with a depth ranging between approximately 13,000 Å and 15,000 Å. In a specific embodiment, the trench T can have a depth of 14,000 Å.

The depth selection can be determined based on the thicknesses of the color filter 152 and the planarization layer 154 that have been shown to cause striation. For example, it has been shown that striation tends to occur when the sum of the heights of the color filter 152 and the planarization layer 154 ranges between approximately 13,000 Å to 15,000 Å.

When the above trench forming process is performed, the height offset between the pixel region and the scribe line can be negated when the color filter 152 and the planarization layer 154 are formed, so that the occurrence of striation can be inhibited during forming of the microlens 160.

Figure 5:
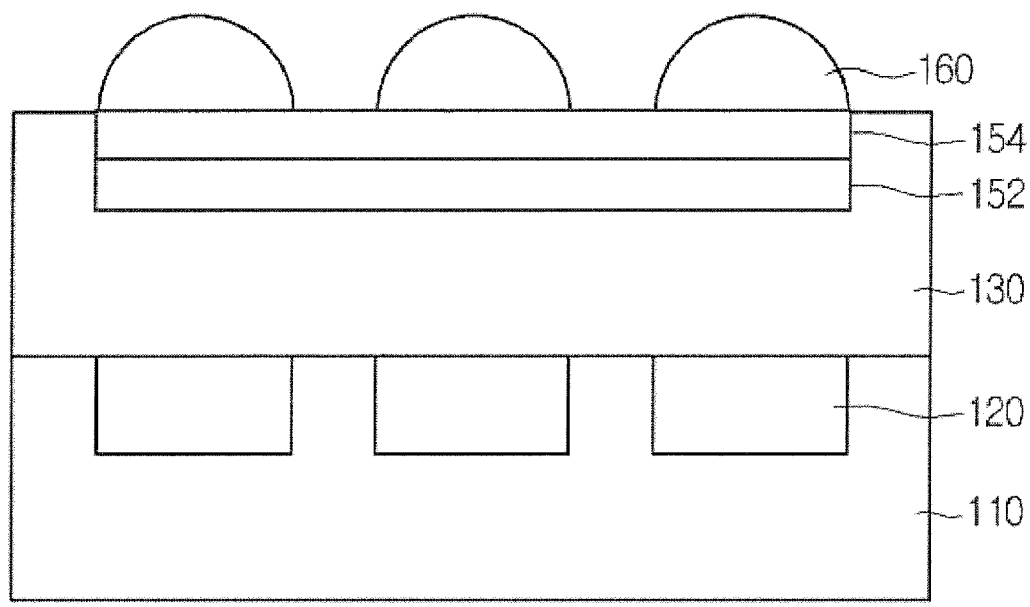

Referring to FIG. 5, a microlens 160 can be formed on the planarization layer 154. In one embodiment, a photosensitive layer (not shown) for the microlens can be applied on the planarization layer 154, and a microlens mask (not shown) can be used to form a photosensitive pattern (not shown) through selectively patterning the photosensitive layer exposure and development processes.

Next, the semiconductor substrate 110, having the photosensitive pattern (not shown) formed thereon, can be placed on top of a hotplate (not shown), and heat of 150° C. or higher can be applied to reflow the photosensitive layer pattern on top of the hotplate to form the hemispheric microlenses 160.

Here, by forming the microlens such that the top surface of the interlayer dielectric 130 and the underside of the microlens 160 are at the same height, a height difference between the pixel region and the scribe line can be negated, which can inhibit the occurrence of striation during the forming of the microlens 160 and increase the sensitivity of the microlens.

As described above, in the image sensor and method for manufacturing the same according to present embodiments, by opening only the pixel region and performing an array etch, the occurrence of striation can be suppressed by reducing the height difference between the scribe line and the pixel region. Accordingly, the sensitivity of the microlens can be increased.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a pixel region defined on a substrate;
   an interlayer dielectric on the substrate, the interlayer dielectric comprising a trench above the pixel region;
   a color filter within the trench;
   a planarization layer on the color filter, and a microlens on the color filter, wherein a top surface of the interlayer dielectric and an underside of the microlens are at the same height.

2. The image sensor according to claim 1, wherein the microlens is on the planarization layer.

3. The image sensor according to claim 1, wherein a depth of the trench is equal to a sum of the thicknesses of the color filter and the planarization layer.

4. A method for manufacturing an image sensor, the method comprising:
   defining a pixel region on a substrate;
   forming an interlayer dielectric on the substrate;
   forming a trench in the interlayer dielectric corresponding to the pixel region;
   forming a color filter in the trench;
   forming a planarization layer on the color filter; and
   forming a microlens on the color filter, wherein forming the microlens comprises forming the microlens such that a top surface of the interlayer dielectric and an underside of the microlens are at the same height.

5. The method according to claim 4, wherein forming the trench comprises selectively etching the interlayer dielectric above the pixel region.

6. The method according to claim 4, wherein the microlens is formed on the planarization layer.

7. The method according to claim 4,
   wherein forming the trench comprises selectively etching the interlayer dielectric above the pixel region until the trench has a depth equal to a sum of the thicknesses of the color filter and the planarization layer.

* * * * *